United States Patent
Pavlov et al.

(10) Patent No.: US 9,507,788 B2
(45) Date of Patent: *Nov. 29, 2016

(54) METHODS AND APPARATUS FOR DISTRIBUTED DATA STORAGE

(71) Applicant: File System Labs LLC, Northbrook, IL (US)

(72) Inventors: Elan Pavlov, Cambridge, MA (US); Stephen Ness, San Francisco, CA (US); Roger Critchlow, Sante Fe, NM (US); Robert Swartz, Highland Park, IL (US); Timothy S. Murphy, Milwaukee, WI (US); Ronald Lachman, Northbrook, IL (US)

(73) Assignee: Impossible Objects, LLC, Northbrook, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/816,039

(22) Filed: Aug. 2, 2015

(65) Prior Publication Data

US 2015/0347435 A1    Dec. 3, 2015

Related U.S. Application Data

(63) Continuation of application No. 13/297,262, filed on Nov. 15, 2011, now Pat. No. 9,098,519, and a (Continued)

(51) Int. Cl.
*G06F 17/30* (2006.01)
*G06F 11/10* (2006.01)
(Continued)

(52) U.S. Cl.
CPC ..... *G06F 17/30094* (2013.01); *G06F 11/1076* (2013.01); *G06F 17/302* (2013.01);
(Continued)

(58) Field of Classification Search
CPC ............... G06F 17/30094; G06F 11/1076; G06F 17/30097; G06F 17/30194; G06F 17/302; G06F 11/2094; G06F 2211/1028

See application file for complete search history.

(56) References Cited

U.S. PATENT DOCUMENTS 5,396,587 A *  3/1995 Reed ............... G06F 17/246
                                                    715/219
6,430,615 B1 * 8/2002 Hellerstein ......... H04L 12/2602
                                                    709/202

(Continued)

OTHER PUBLICATIONS

SAS (SAS 9.1.3 Open Metadata Interface, second edition, Nov. 2007), https://support.sas.com/documentation/onlinedoc/91pdf/sasdoc_913/omd_gs_9971.pdf.*

*Primary Examiner* — April Y Blair
*Assistant Examiner* — Dipakkumar Gandhi
(74) *Attorney, Agent, or Firm* — Flachsbart & Greenspoon, LLC

(57) ABSTRACT

A distributed heterogeneous or homogeneous file storage system divides logical responsibility for data from actual control of the data by using separate file and storage managers. Each file manager provides access to stored files and stores metadata associated with each of the files for which it is responsible. A file manager control component allocates responsibilities among file managers, assigns management responsibilities for individual files, and maintains a record of which files are assigned to each manager. Each storage manager is responsible for managing storage of files on data storage devices and maintains a record of the location of each stored file. A storage manager control component allocates responsibilities among storage managers, assigns responsibilities for individual files, and maintains a record of which files and storage devices are assigned to each manager. A client provides user access, initiates actions within the system, and implements a redundant data recovery and reconstruction scheme.

22 Claims, 8 Drawing Sheets

Related U.S. Application Data continuation-in-part of application No. 12/561,252, filed on Sep. 16, 2009, now abandoned.

(60) Provisional application No. 61/413,793, filed on Nov. 15, 2010, provisional application No. 61/175,779, filed on May 5, 2009, provisional application No. 61/097,345, filed on Sep. 16, 2008.

(51) Int. Cl.
  *G06F 17/24* (2006.01)
  *G06F 11/20* (2006.01)

(52) U.S. Cl.
  CPC ... *G06F17/30097* (2013.01); *G06F 17/30194* (2013.01); *G06F 11/2094* (2013.01); *G06F 2211/1028* (2013.01)

(56) References Cited

U.S. PATENT DOCUMENTS

| | | | |
|---|---|---|---|
| 6,466,978 B1* | 10/2002 | Mukherjee | G06F 3/061 |
| | | | 348/E5.008 |
| 2002/0156974 A1* | 10/2002 | Ulrich et al. | 711/114 |
| 2003/0065656 A1* | 4/2003 | de la Torre et al. | 707/3 |
| 2003/0074352 A1* | 4/2003 | Raboczi | G06F 17/30545 |
| 2003/0187860 A1* | 10/2003 | Holland | 707/100 |
| 2006/0242155 A1* | 10/2006 | Moore | G06F 17/30206 |
| 2007/0207755 A1* | 9/2007 | Julia | H04N 1/00127 |
| | | | 455/217 |
| 2008/0065704 A1* | 3/2008 | MacCormick | G06F 17/30215 |
| 2008/0164306 A1* | 7/2008 | Gu | 235/379 |
| 2009/0271412 A1* | 10/2009 | Lacapra et al. | 707/10 |

\* cited by examiner

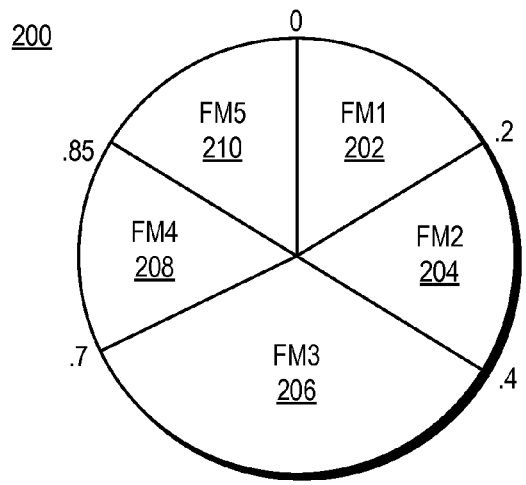
FIG. 2A
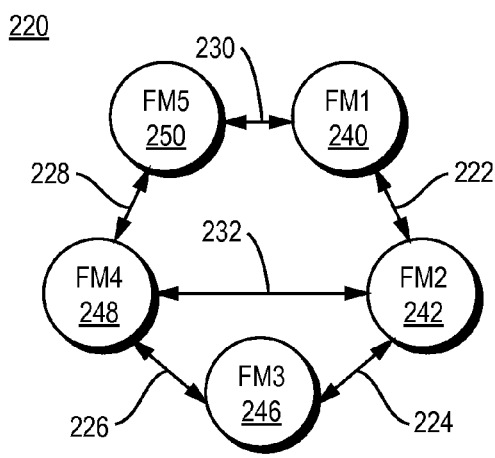
FIG. 2B
| FM | RANGE | PRED. | SUCC. | OTHER |
|---|---|---|---|---|
| FM1 | [0, .2) | FM5 | FM2 | |
| FM2 | [.2, .4) | FM1 | FM3 | FM4 |
| FM3 | [.4, .7) | FM2 | FM4 | |
| FM4 | [.7, .85) | FM3 | FM5 | FM2 |
| FM5 | [.85, 1.0) | FM4 | FM1 | |
FIG. 2C

METHODS AND APPARATUS FOR DISTRIBUTED DATA STORAGE

RELATED APPLICATIONS

This application claims the benefit of U.S. Provisional Application Ser. No. 61/413,793, filed Nov. 15, 2010, the entire disclosure of which is herein incorporated by reference.

This application is a continuation of U.S. patent application Ser. No. 13/297,262, which is a continuation-in-part of U.S. patent application Ser. No. 12/561,252, filed Sep. 16, 2009, which claims the benefit of U.S. Provisional Application Ser. No. 61/097,345, filed Sep. 16, 2008, and U.S. Provisional Application Ser. No. 61/175,779, filed May 5, 2009. The entire disclosures of these applications are herein incorporated by reference.

TECHNICAL FIELD

The present invention relates generally to data storage and, in particular, to a dynamically scalable redundant distributed storage system and method.

BACKGROUND

A fault-tolerant, or "recoverable", storage system is one that permits recovery of original data even in the event of partial system failures. A system can achieve recoverability by any of several means. One such method is replication, i.e. by keeping multiple copies of data. Replication is the primary recovery method used in RAID ("Redundant Array of Independent Disks") systems. Alternatively, a system can use an error correction code ("ECC") with proper redundancy to achieve recoverability. In general, error correction codes, of which erasure codes are a subset, are data representations that allow for error detection and error correction if the error is of a specific kind Replication and error correction coding both use redundancy in order to ensure fault tolerance. The use of one or the other, or both, has been a design option for fault-tolerant storage systems since the earliest days of RAID.

A distributed hash table ("DHT") stores (key, value) pairs in a distributed system consisting of a set of nodes. Each node is responsible for a unique subset of keys, and all the nodes together are responsible for all possible keys. For example, if the keys are numbers in the range [0,1), then each node could be responsible for a connected subrange of numeric keys. Each node knows its neighboring nodes (i.e., it can communicate with its neighbors directly), so the DHT typically, although not necessarily, consists of a ring of nodes. A node can also be aware of other non-neighboring nodes, in order to increase connectivity and decrease the communication distance (hops) between nodes. A DHT can find the node responsible for a given key by starting at any node. If the node is not itself responsible for the key, then it queries the node it knows with the key closest to the desired key. This "greedy algorithm" converges quickly (generally logarithmically or better) to find the node responsible for the desired key.

Currently, in existing storage systems that employ error correction code redundancy schemes, responsibility for storage of data and for maintenance of storage data resides in a single component. Such systems do not employ distributed hash tables and do not disconnect the responsibility for the storage from the actual maintenance of the storage. As a result, these systems have single points of failure and cannot reconstruct failed drives in less than the time it takes to rewrite the entire drive.

SUMMARY

The present invention is a dynamically scalable redundant distributed storage system and method. The system may be implemented as a distributed heterogeneous or homogeneous file storage system with robust failure recovery. The system requires no special hardware, and is highly scalable. The system design divides the logical responsibility for the data from the actual control of the data by using separate file and storage manager components. A preferred embodiment of the system employs inexpensive heterogeneous components and a distributed hash table (DHT).

In one aspect, the invention is a dynamically scalable redundant distributed storage system comprising a set of file managers, each of which is responsible for providing access to stored files or data blocks and storing metadata associated with each of the files and data blocks for which it is responsible, the metadata including a unique file identifier for each file or data block; a file manager control component that allocates individual responsibilities among the file managers, assigns file management responsibilities for individual files and data blocks to individual file managers, and maintains a record of which files and data blocks are assigned to each file manager; a set of storage managers, each of which is responsible for managing the storage of files and data blocks on one or more data storage devices for which it is responsible and maintaining a record of the location of each stored file and data block on the data storage devices; a storage manager control component that allocates individual responsibilities among the storage managers, assigns file storage responsibilities for individual files among the individual storage managers, and maintains a record of which files and data storage devices are assigned to each storage manager; and at least one client that provides user access to the storage system, initiates actions within the storage system by means of the file manager control component and the storage manager control component, and implements a redundant data recovery and reconstruction scheme.

The file manager controller and the storage manager controller may be implemented using distributed hash tables. The distributed hash tables may be implemented as lists. The file manager distributed hash table list may comprise an entry for each file manager, each entry comprising a range of unique file identifier values assigned to the files or data blocks for which the file manager is responsible. The physical devices comprising or hosting the components comprising the storage system may be heterogeneous or homogeneous. The components of the system may be implemented in software using functional programming. The redundant data recovery and reconstruction scheme may employ error correction code methods, including matrix-based erasure codes, or may employ file replication methods. Any single component may be replaced by a group of components. Additional components may be added to the system dynamically while the system is in use. A component that has failed and then been repaired may be reutilized by the storage system. A file manager may act as a client. The system may be asynchronous, having no system clock. The file manager control component and storage manager control component may perform load balancing. The level of redundancy required by the redundant data recovery and reconstruction scheme for each file or data block may be assigned individually to each file or data block. The level of redundancy required by the redundant data recovery and reconstruction scheme may take the form of predetermined minimum and maximum redundancy levels.

In another aspect, the present invention is a method for ensuring restoration and integrity of data in computer-related applications using a dynamically scalable redundant distributed storage system that includes the steps of: dividing logical responsibility for files and data blocks from actual control of the files and data blocks by providing a group of file managers, each file manager having responsibility for providing access to a group of stored files or data blocks and configured to store metadata associated with each of the files and data blocks for which it is responsible, the metadata including a unique file identifier for each file or data block; allocating individual responsibilities among each of the plurality of file managers by assigning file management responsibilities for individual files and data blocks to individual file managers; maintaining a record of which files and data blocks are assigned to each file manager; providing a group of storage managers, each storage manager having responsibility for managing the storage of files and data blocks on one or more data storage devices for which it is responsible and configured to maintain a record of the location of each stored file and data block on the data storage devices; allocating individual responsibilities among each of the plurality of storage managers by assigning file storage responsibilities for individual files among individual storage managers; and maintaining a record of which files and data storage devices are assigned to each storage manager; implementing a redundant data recovery and reconstruction scheme; assigning a unique file identifier to each file or data block; storing, according to the redundant data recovery and reconstruction scheme, the metadata associated with each of the files and data blocks, including the unique file identifier for each file or data block; storing, according to the redundant data recovery and reconstruction scheme, the files and data blocks on one or more data storage devices; and recording the location on the data storage devices of each stored file and data block.

The method may include the step of providing user access to the storage system by means of a client that initiates actions within the storage system. The steps of allocating individual responsibilities among file managers and maintaining a record of which files and data blocks are assigned to each file manager may be performed by a file manager control component. The file manager control component may be a distributed hash table. The steps of allocating individual responsibilities among storage managers and maintaining a record of which files and data storage devices are assigned to each storage manager may be performed by a storage manager control component. The storage manager control component may be a distributed hash table. The redundant data recovery and reconstruction scheme may employ error correction code methods or replication of files and data blocks. The method may include the step of reconstructing data by the steps of: detecting loss or corruption of files or data blocks; retrieving stored metadata for the files or data blocks; using the retrieved metadata, locating, retrieving, and reconstructing the stored files and data blocks; and reallocating responsibility for the reconstructed data. The method may include the step of individually assigning, for each file or data block, the level of redundancy required by the redundant data recovery and reconstruction scheme. The method may include the step of establishing minimum and maximum redundancy levels to be required by the redundant data recovery and reconstruction scheme.

The metadata may be discovery metadata comprising a unique key for each file or data block, a predetermined desired redundancy level and type of data recovery, and reconstruction scheme designation for each file or data block. The file manager control component may be a distributed hash table that supports addition and removal of file managers, load balancing, and associating keys with responsible file managers. The storage manager control component may be a distributed hash table supports addition and removal of storage managers, load balancing, and associating keys with responsible storage managers. Each storage manager may be able to be accessed to write, retrieve, and modify the data on any file or data block it is responsible for. The storage managers may be able to lock file or data blocks. Each file manager may be associated with discovery metadata about the file manager and the file manager discovery metadata may be stored in a file or data block in the distributed storage system.

In a further aspect, the present invention is a method for ensuring restoration and integrity of data in computer-related applications using a dynamically scalable redundant distributed storage system that comprises the steps of: distributing data file storage across a plurality of data storage devices by breaking each data file into to shreds and distributing the shreds across multiple data storage devices; reconstructing failed data storage devices by using redundancy or duplication to recover the stored data files on the failed data storage devices; and restoring the recovered data files by distributing them across, and storing them on, free space on the remaining data storage devices. In yet another aspect, the invention is a distributed storage system configured to rapidly reconstruct a failed storage element by distributing data storage across a number of storage elements and reconstructing data stored on the failed storage element by breaking each data file into shreds, distributing the shreds across multiple storage elements, using redundancy or duplication to recover the data from errors, and distributing the recovered data onto free space on the remaining system storage elements.

BRIEF DESCRIPTION OF THE DRAWINGS

The drawings depict illustrative implementations of this invention or provide information that relates to those implementations. This invention may be advantageously implemented in any of the many other ways that will be apparent to one of skill in the art of the invention. Other aspects, advantages and novel features of the invention will become more apparent from the following detailed description of the invention when considered in conjunction with these accompanying drawings. In the drawings:

FIG. 2A-C are three views of an exemplary embodiment of a file manager distributed hash table (DHT) with five nodes, according to one aspect of the present invention. FIG. 2A presents the distributed hash table as a circle, FIG. 2B presents it as a graph, and FIG. 2C presents it as a list.

DETAILED DESCRIPTION

Figure 1:
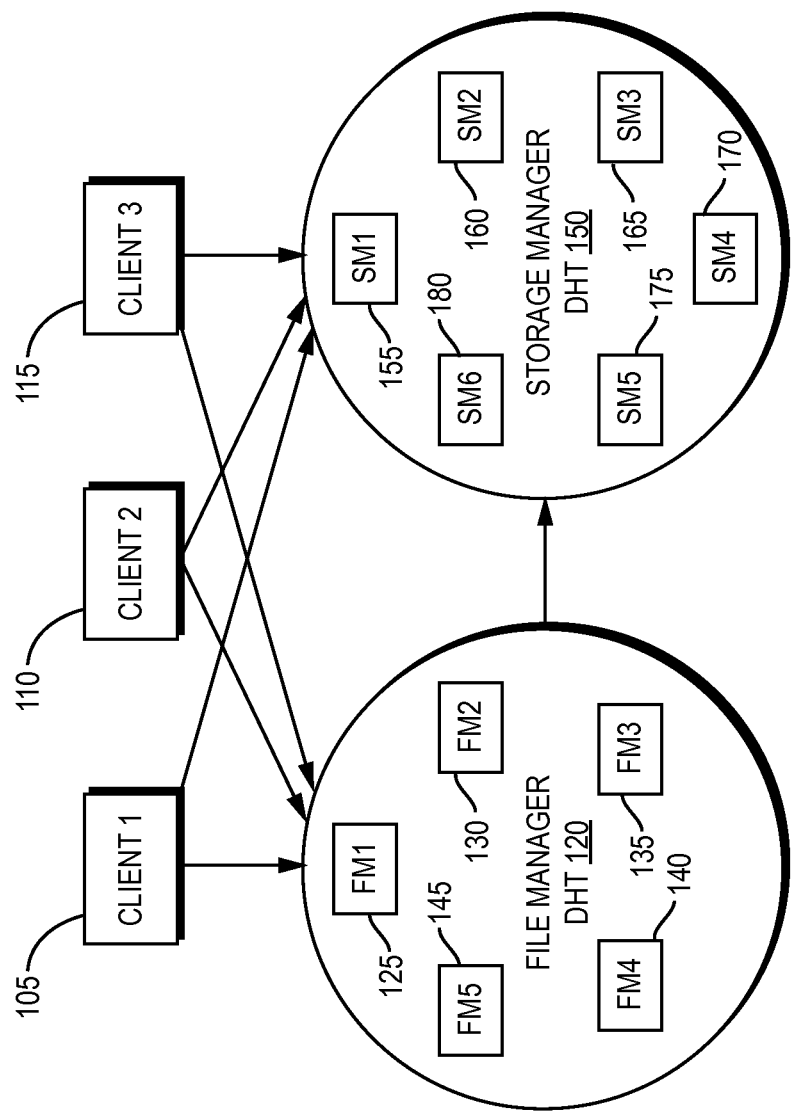
FIG. 1 is a high-level overview of the functional structure of an exemplary embodiment of a dynamically scalable redundant distributed storage system according to the present invention.

The present invention is a dynamically scalable redundant distributed storage system and method. A system according to the present invention distributes storage over a set of storage devices, sometimes called nodes, using redundancy to allow recovery after node failures. The system divides the logical responsibility for the data, which is given to a file manager in a preferred embodiment, from the actual control of the data, which is held by a storage manager in the preferred embodiment.

As used herein, the following terms expressly include, but are not to be limited to:

"Client" means a component that allows a user to access the file storage system. A file system component (such as a file manager) sometimes also acts as a client.

"Component" means a system component (or node) that is computer process implementing, for example, a client, a file manager, or a storage manager. A single server can provide one or more components.

"Data" means the actual content of a file, as opposed to file metadata.

"Distributed hash table" and "DHT" mean a hash table that shares (key,value) pairs among a number of servers called nodes. It allows load balancing between servers, can detect and respond to server failures, and provides relatively quick access time.

"Error correction code" means data representation that allows for error detection and correction if the error is of a specific kind. An error correction code (ECC) uses redundant information to recover data despite the occurrence of errors. For example, a file may be stored in multiple pieces with checksums to allow the recovery of the file if some pieces are lost. As defined herein, "error correction code" and "ECC" do not include replication.

"Erasure code" means an error correction code that transforms source data of k blocks into data with n blocks (n being more than k), such that the original data can be reconstructed using any k-element subset of the n blocks. Erasure codes are a specific subset of error correction codes.

"File manager" and "FM" mean a component responsible for accessing a file in the file storage system. Each file manager stores metadata for the files for which it is responsible.

"Metadata" means information about a file, such as its size, location, creation time, modification time, access permissions, redundancy parameters, and the like. Metadata is all forms of data that describe a file, as opposed to being the data in the file itself. In general, the size of this information is much smaller than the size of the file itself.

"(n, k)" are error correction code (ECC) parameters, wherein n gives the total number of shreds, k gives the number of shreds required for reconstruction.

"Redundancy" means a file storage method that maintains multiple shreds or multiple copies of the file, such that any copy can be accessed independently. Both ECC and replication are redundant storage methods.

"SHARDS" means "Scalable Heterogeneous And Redundant Distributed Storage", which is the name given by the inventors to a particular preferred embodiment of the present invention, which embodiment has been implemented as a prototype of a system according to the present invention.

"Shred" means a piece of stored file data, required to retrieve or reconstruct a part of a file. If the file has been replicated, then only one shred is required for reconstruction. If redundancy is achieved by ECC, then multiple shreds are required for the reconstruction.

"Storage manager" and "SM" mean a component that manages data storage on one or more data devices.

"Stripe" means a piece of a file with a predetermined size.

In one aspect, the invention can be viewed as providing a protocol for the coordination and behavior of several agents, providing an extremely reliable storage system that supports addition, subtraction, and recovery from asynchronous failure of agents, all without interruption of service. In this context, an agent is a computing device capable of communication with other agents, retention of information, and on-demand transmission of information derived from the retained information. In an exemplary embodiment, an agent is a computer communicating with other agents via TCP/IP (on a local network or the global internet), retaining information using semiconductor memory supplemented with a solid-state or conventional disk-based file storage system. In distinction from existing systems, such as redundant disk arrays, there are no constraints on the location of agents and, beyond support for the defined protocols, there is no required homogeneity among agents. In this context, a storage system is a device for acceptance, retention, and production of user-supplied information. Information to be retained is associated, at the time of acceptance, with another piece of information, known as the "key", which is used to identify the retained information upon retrieval. Within a single storage system, distinct pieces of information are associated with distinct, unambiguous keys. While some of the utility of a storage system derives from the indirection between keys and stored values, i.e., that a storage system can be thought of as a lookup table or dictionary, the phrase "storage system" emphasizes the fact that retained values, considered numerically, are larger than are their associated keys and thus require more physical media for their retention (in common parlance, a file is bigger than a file name, a disk block is bigger than a block index). Common examples of storage systems include disk drives, in which (typically) fixed-size contiguous blocks of data are keyed by numeric indices ("block numbers"), and conventional file systems, in which variable-sized (typically) contiguous blocks of data are keyed by character strings ("file names").

A system according to the present invention may be implemented as a distributed heterogeneous or homogeneous file storage system with robust failure recovery. The system uses storage efficiently and provides fast access to data. Having no centralized control point, it can tolerate and recover from the failure of one or more components more quickly than conventional systems. The system requires no special-purpose hardware, and is dynamically scalable. In a preferred embodiment, the system employs inexpensive heterogeneous components, but it will be clear to one of skill in the art that it can equally employ homogeneous components. Since the file system can be heterogeneous and new machines can be added at will, including while the system is running, and the average cost of adding storage is constant (logarithmic in worse case), the system scales efficiently.

In the preferred embodiment, the system is fully distributed, with multiple cooperating components that communicate with one another directly, without a centralized control point and without the use of a synchronizing system clock. Instead, local clocks are used for leases and error detection timeouts. Because the system divides the logical responsibility for the data from the actual control of the data, ownership of the data can be reconstructed extremely quickly, while the responsibility for reconstructing the actual data is distributed. Since recovery of the actual data is the part that is extremely slow, it can be distributed among the entire system. This permits utilization of the entire bandwidth of the system, as opposed to the bandwidth of a single machine.

The system of the invention assumes that at most a fixed number of nodes may fail at any given time, and it guarantees data integrity as long as the assumed number of failures is not exceeded. The system can survive even a large number of failures as long as the speed of failure is not larger than the speed of recovery (which is extremely fast). It can be scaled and enlarged with more machines without affecting the speed of access of currently used machines.

The preferred embodiments of the system use either error correction codes (ECC) or replication for distributed storage. For example, the error correction code used may be an erasure code, such as a Cauchy-Reed-Solomon erasure code. A preferred embodiment of the use of such a code is described in co-pending U.S. patent application Ser. No. 12/561,252, entitled "Matrix-Based Error Correction And Erasure Code Methods And Apparatus And Applications Thereof", which has herein been incorporated by reference in its entirety. If error correction coding is used, the system stores shreds of a file on multiple nodes. If replication is used, the system stores copies of a file at multiple nodes.

In a preferred embodiment, a client may set the desired redundancy (robustness) level on a per-file basis. In addition to user files (files created by clients), a system according to the invention also stores system files (files created by the system itself) with a given redundancy level. Specifying a higher redundancy level for files under high demand allows the system to perform more efficient load balancing. It also permits the system to take geographical demands into account. The system also supports the specification of multiple and maximum redundancy levels as an alternative to a single fixed redundancy level. In such a case, the system repairs failures only when it reaches the minimum redundancy level, and it creates additional redundancy until it reaches the maximum level The level of redundancy for each file essentially specifies how many nodes can fail in the worst case without compromising the ability of the system to reconstruct the file. The system recovers very quickly from failures, so long as the number of failures is not greater than the specified number of tolerated failures. For example, if the system uses ECC, stores eight shreds on separate nodes, and requires four shreds for reconstruction, then it will always be able to reconstruct so long as fewer than five nodes fail. Similarly, if the system uses replication to, for example, store five copies of a file on separate nodes, it will always be able to produce the file if fewer than five nodes fail, but recovery of the file might be impossible if five or more nodes fail.

In a preferred embodiment, the system employs a distributed hash table (DHT). Unlike current DHT-based systems such as Bittorrent, the present invention can achieve faster than logarithmic storage access and assures data availability in the presence of multiple disk failures. A distributed hash table provides a convenient way of organizing a group of computers (nodes). While a distributed hash table is used throughout this disclosure in the description of the preferred embodiment of the invention, many other implementations of the same functionality provided by this element will be clear to one of skill in the art of the invention and are considered by the inventors to be within the scope of the invention.

In a preferred embodiment of the invention, a file storage system is implemented using two DHTs: one DHT that forms a group of file managers and another DHT that forms a group of storage managers. This embodiment stores each file identifier as a key in the file manager DHT. Each node in the file manager DHT has a corresponding file manager, responsible for all files with file identifiers (keys) within a given range. Similarly, the embodiment stores a block identifier for each available storage unit as a key in the storage manager DHT. Each node of the storage manager DHT has a corresponding storage manager. Because of this structure, the system of this embodiment has a single point of responsibility for each file and for each storage block; that is, a specific file manager is responsible for a given file at any given time, and a specific storage manager is responsible for a given block at any given time.

To create a file in this preferred embodiment, a client (typically a user process, although in some instances a system process) contacts the responsible file manager through the file manager DHT (e.g., by choosing a random number as file id and asking which DHT node is responsible for that key) and receives permission to create the file. Once created, file information is a (key, value) pair in the DHT, where the key is the file id and the value is file metadata stored by the file manager. Responsibility for the file can change over time as the DHT is modified (for example, moving to a different file manager node due to load balancing), but a single node is responsible for any given file at any time.

The file manager assigns the disk storage required for the file to various storage managers. The storage managers actually allocate disk space and report back to the file manager. The parallel use of multiple storage managers speeds up file access, as access need not be limited by the disk bandwidth available on a single storage device. A directory (file tree-structure) can simply be a file containing a list of file identifiers, and is itself stored in the file manager DHT so that directories are robust against failure, just like other files.

A key aspect of the present invention is that it separates the responsibility for storing file data, which is handled by storage managers, from the responsibility for storing information about the file (i.e., file metadata), which is handled by file managers. The amount of file metadata is generally very small relative to the amount of file data. Disentangling file data from metadata therefore allows the system to distribute file data over multiple storage units. This allows the system to add new components (file managers and storage managers) in order to dynamically scale storage capacity.

A preferred embodiment uses the file manager DHT to maintain a file store that is distributed across multiple servers. It adds a level of data maintenance, using the DHT to ensure that file metadata stored by a file manager persists even if the file manager fails. Unlike competing systems, the system backs up metadata in the distributed storage system itself, assuring its robustness even after a file manager failure.

The embodiment also uses the DHTs to detect component failures and to allocate the responsibility for reconstruction when failures occur. In the normal state, every file stored in the system has the desired level of redundancy. After component failures, some files may not have the desired level of redundancy, so the system is in a recovery state until it restores the desired redundancy. By design, the system is in the recovery state for a minimal amount of time following any node failure. If too many component failures occur, so that it is impossible to reconstruct a file, then the system is in a corrupted state. The system enters the corrupted state only if the number of component failures exceeds the specified maximum.

The division of the system between the responsibility for a file (file manager) and the responsibility for actually storing the file (storage manager) permits dynamically adding new servers to the system. When adding a new file manager, the new file manager is first added to the DHT and then takes responsibility for a subset of the files whose values lie in a given range. Since the metadata file is extremely small, it is easy to transfer responsibility for a file. Adding a storage manager is also easy, by simply adding a storage manager with responsibility for a small area (a small area which is empty can always be found) and using the DHT (or other) load balancing to increase the responsibility of the new storage manager. It is also possible to remove file managers by merging metadata files. Removing storage managers can be done by slowly moving files (and responsibility) to adjacent storage managers and letting the load balancing mechanism deal with the rest of the system.

The use of redundancy introduces several performance tradeoffs. When the system needs to retrieve a file, it can request multiple copies of the file (if stored redundantly) or extra shreds (if stored using an ECC). This results in faster receipt of sufficient data to provide the required file, but at the cost of increased system load. Similarly, the system can require the receipt of more copies or shreds than needed before it provides the file, allowing it to check the received data for correctness, but at the cost of slower performance.

FIG. 1 presents a high-level overview of the functional structure of an exemplary embodiment of a dynamically scalable redundant distributed storage system according to the present invention. As shown in FIG. 1, three clients 105, 110, 115 communicate with file manager DHT 120 containing 5 nodes 125, 130, 135, 140, 145 and with storage manager DHT 150 containing 6 nodes 155, 160, 165, 170, 175, 180. Each file manager or storage manager node may reside on a separate server, or a single server may be host to multiple nodes, or, as will be clear to one of skill in the art of the invention, any combination of servers hosting single nodes and servers hosting multiple nodes may be advantageously employed in the invention.

A system according to the present invention requires no special purpose hardware. For example, in a prototype embodiment, the system hardware comprises a set of commodity personal computers running Linux and communicating via TCP/IP networking. An advantage of the invention is that storage units (disks) can be heterogeneous, constructed from components with different properties (such as, for example, storage units with varying storage capacities), and an administrator can add or remove storage units without interrupting the operation of the system. In addition, the replacement for a failed component does not need to be a single unit; rather, any component can be replaced with either another single component or by multiple components. In some embodiments, the system can be made up of systems running different operating systems, and thus is heterogeneous in that fashion.

In the prototype embodiment, software comprises programs written in the functional programming language Erlang, using Scalaris as a DHT. This takes advantage of the parallel processing capabilities of Erlang. While a prototype embodiment is described, it will be clear to one of skill in the art of the invention that many other implementations are possible, for example, on small single-board computers with ARM processors and SATA disks as hardware, and/or with software written in C, C++, or any other suitable language.

In a preferred embodiment, the distributed file system uses functional programming idioms at all levels. The data maintained by the file manager and storage manager consists of a functional key-value store in which FileIdentifers or BlockIdentifiers are the keys and the FileMetadata or BlockMetadata are the values. Time consuming operations performed on file manager or storage manager data are designed to work with a copy of the manager data and send update notifications to the affected file manager or storage manager when the operations complete. The manager decides whether the notifications are incorporated into the live copy of the manager data or discarded if they have been obsolesced while being computed. This idiom is applied to operations on the entire set of data kept by a manager and to operations on a single file or block data.

A preferred embodiment of the invention uses a distributed hash table (DHT) as a component. A DHT may be thought of as a division of a circular address space (its key space) into sectors, such that each DHT node is responsible for one sector of the address space. For example, the address space might be keys in the numeric range [0,1), with each node responsible for a connected segment of the range. The DHT maintains connections (communication paths) between nodes, forming a graph with DHT nodes as points and connections between nodes as edges. Each node connects directly to its immediate neighbors, i.e., to the two nodes responsible for its neighboring segments. Each node also connects to some additional nodes—which additional nodes those are depends on the specific DHT implementation. The DHT routing mechanism allows it to efficiently find the node responsible for any key. The DHT uses non-adjacent connections for more efficient long-distance routing; for example, the routing algorithm may be a greedy algorithm. Close key values are generally controlled by nodes connected via a short path (i.e., by a small number of hops). These DHT attributes result in a polylogarithmic routing mechanism to find any key, with polylogarithmic out-degree and in-degree for any node.

There are different types of distributed hash tables. It will be clear to one of skill in the art of the invention that the specific DHT implementation details will differ between the various types of DHTs. For the preferred embodiment of the invention, the specific choice of DHT implementation is unimportant, as long as the DHT has the ability to find any key with low cost, low degrees, and some type of load-balancing. Which type of DHT is selected will therefore depend on the particular system implementation. Some of the factors to consider when choosing a DHT are the out-degree (number of neighbors each node has), the speed of routing from any two points, the load balancing properties, and the communication overhead of the system. In some cases, the use of a geographically load-balanced DHT is preferable.

While the preferred embodiment of the invention employs a distributed hash table in order to divide responsibility among a set of machines, such that every file has a single machine responsible for it, it will also be clear to one of skill in the art of the invention that any mechanism that allocates responsibility for file maintenance among the machines can be advantageously employed in the present invention. This responsibility does not have to be unique. For example, but not limited to, a byzantine quorum system may be used to allocate responsibility. Similarly, any agreement protocol may be employed.

In an embodiment employing a DHT, the DHT reallocates DHT address space and updates DHT connection paths whenever a new node is added to the DHT. When a new file manager or storage manager is added to the system, the added node announces itself to the file manager DHT or storage manager DHT. This allows the system to add new file managers or new storage managers (that is, additional storage) with no disruption in its operation. As will be clear to one of skill in the art of the invention, the specific DHT algorithms and interface implementation details will depend on the choice of a specific DHT implementation. The DHT implementation will preferably ensure that keys are generally load-balanced, so that no node is responsible for a 'relatively' large number of keys. Access frequency among the nodes of the DHT should be fairly uniform to achieve file manager load balancing. The DHT interface typically includes the abilities to add/remove nodes from the DHT, to load balance, to insert and remove key/value pairs, and to query an existing key to get the associated value.

While logical separation of the DHT from the data has many advantages, it also has some possible disadvantages. In particular, logarithmic number of hops is often considered desirable for DHTs (that is, the communication distance between any two nodes is logarithmic in the number of nodes). For a file system, this may be problematic. For some applications, such as torrent files, the quantity of data, and hence the time required to retrieve the data, massively dwarfs the logarithmic time required to find the data. For other applications such as, for example, retrieving a small amount of data, even a logarithmic delay may be insufferable. Many existing file systems avoid this problem by allowing direct access to files. However, this is costly for other aspects of the system, such as dealing with failures.

While the DHT has been previously described as a graph, it will be clear to one of skill in the art of the invention that it is also possible to view a DHT as a list. The list contains an entry for each node, giving the range of values for which the node is responsible. The file manager is a node in the file manager DHT that is responsible for a given range of keys (file identifiers). By the construction of the DHT, exactly one node is responsible for any key. A preferred embodiment of the present invention stores each file with a unique file identifier, a number in the range [0,1). Node i in the file manager DHT is responsible for file f if the file id (key) for f is k and the range for which node i is responsible contains k. By the properties of the DHT, this node is unique; that is, a unique file manager node is responsible for any given file. Each file manager node i maintains metadata for every file for which it is responsible. In general, all access to file f is performed through file manager i. Since each file has a single responsible file manager node, the system can use the file manager to implement properties typically associated with centralized systems, such as locking.

The file manager controls creation, deletion and modification of metadata associated with a file. The file manager mediates all access to the files for which it is responsible and can implement some types of locks. The file manager maintains metadata for all files for which it is responsible and ensures that the metadata can survive even if the file manager itself crashes by distributing the metadata in the distributed system. The file manager also keeps in touch with its neighboring DHT nodes and defines the current status of neighboring nodes by agreement with other DHT nodes. Since some files are seldom accessed by clients, the file manager preemptively performs error checking (scrubbing) for files that have not been checked in a long time. The file manager metadata for each file includes the most recent file scrub time.

FIGS. 2A-C are three views of an exemplary embodiment of a file manager distributed hash table (DHT) with five nodes, according to one aspect of the present invention. FIG. 2A presents the table as a circle 200, with each sector 202, 204, 206, 208, 210 representing the portion of the key space [0, 1) for which a file manager (FM) is responsible. FIG. 2B presents it as a graph 220, with each arrow 222, 224, 226, 228, 230 representing a communication path between two of the file manager nodes 240, 242, 246, 248, 250. FIG. 2C presents it as a list 260 containing the range 262 and graph 264 information for each file manager 266 in the DHT.

A system according to the invention uses this multiplicity of representations of the DHT to solve the access issue. Given the list, a node can access data efficiently by simply looking up the node responsible for any given key. Of course, due to the distributed nature of the DHT, the list may not be completely accurate when used, since constructing the list takes time, during which a node failure or DHT rebalancing might occur. However, even if the list is outdated, it still leads to a node that is close to the desired node, so a very small number of hops leads to the node currently responsible for the desired key.

The storage manager is responsible for management of a storage device (typically, a physical disk). The present invention does not assume that the sizes of storage devices are the same; thus, the underlying storage can be heterogeneous. The storage manager simply reads or writes data to the device when requested. In addition, for some files (depending on the metadata), the storage manager can lock data on a byte level. Since the storage manager is responsible for disk management, in particular, it implements a disk allocation strategy based on a standard algorithm for allocating local disk space (such as, for example, "first free"). The exact algorithm is not critical, and, as will be apparent to one of skill in the art of the invention, can be determined for any particular implementation based on workload analysis. The storage manager can be accessed to write, retrieve and modify the data on any block it stores. Potentially, the storage manager can also implement some types of locks.

Figure 3A:
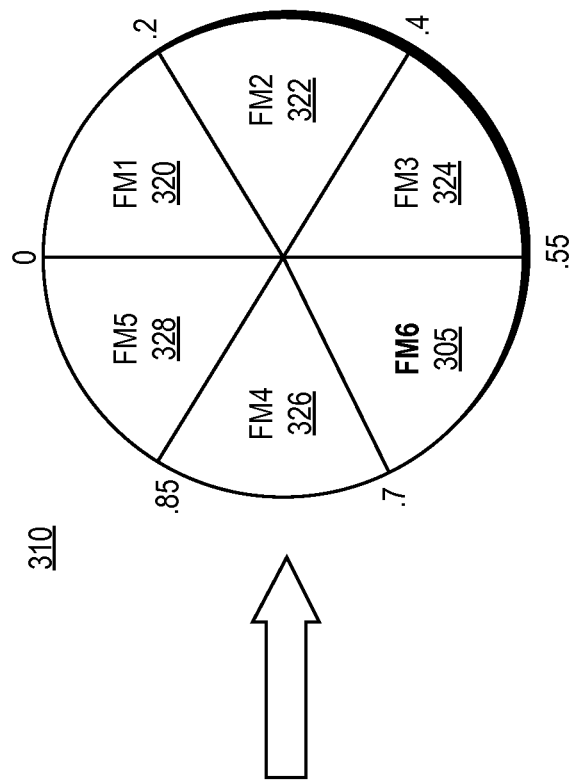
FIG. 3A depicts an example of the addition of a node to a distributed hash table.
Figure 3A:
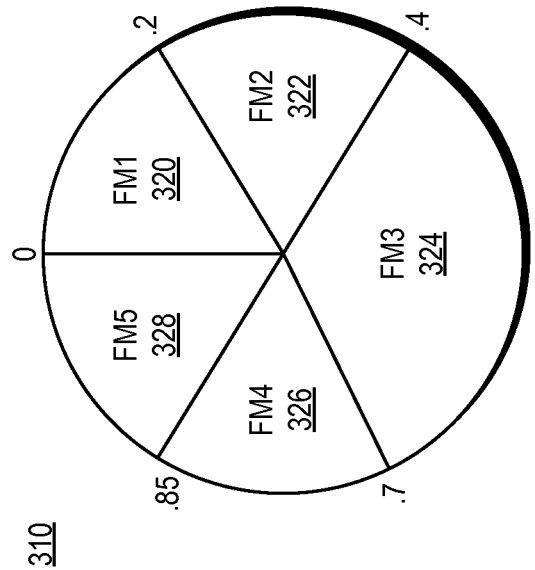
Figure 3B:
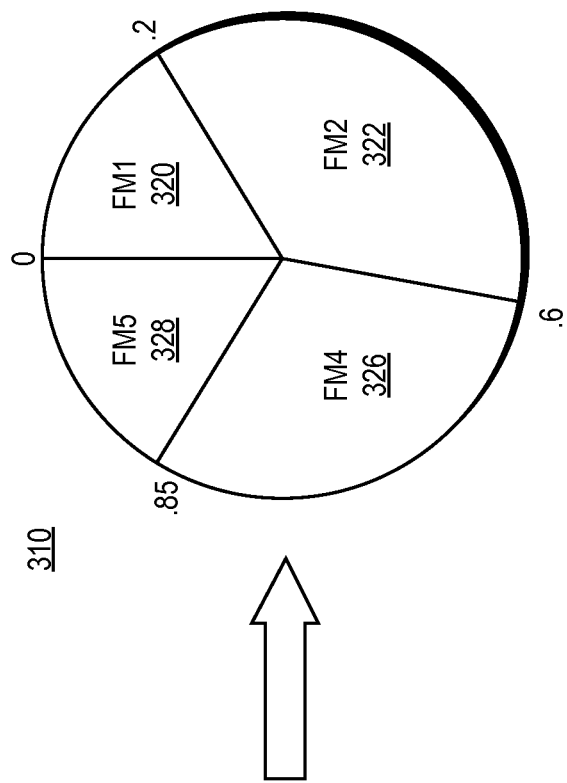
FIG. 3B depicts an example of the removal of a node from a distributed hash table, according to one aspect of the invention.
Figure 3B:
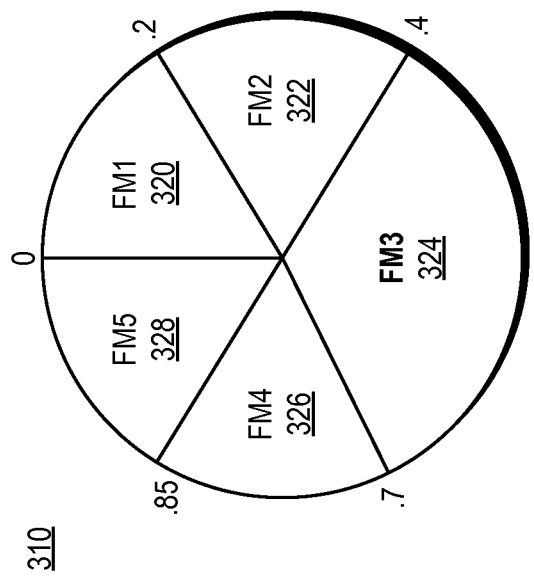

FIGS. 3A-B depict examples of the modification of a file manager DHT by addition or removal of a node. In FIG. 3A, node FM6 305 is added to file manager DHT 310 with five existing nodes 320, 322, 324, 326, 328, with node FM6 305 becoming responsible for part of the sector for which node FM3 324 was previously responsible. In FIG. 3B, node FM3 324 is removed from file manager DHT 310, with neighboring nodes FM2 322 and FM4 326 assuming responsibility for the sector for which node FM3 324 was previously responsible. The example presented in FIGS. 3A-B depicts a file manager DHT, but it will be clear to one of skill in the art of the invention that modification of a storage manager DHT example would be similar.

In a preferred embodiment, a client initiates file read, write, modify, and other operations. The client typically is a file system daemon running on the user's computer. For some special files (such as metadata files), a file manager may also be a client. In general, a client checks for errors whenever it accesses a file. If it detects an error (e.g., via extrapolating an ECC), the client notifies the responsible file manager. The client then attempts to fix the corrupted file by returning it to the required redundancy. If the client does not return to the file manager within an allocated time, the file manager then completes the required correction itself.

The client effectively represents the file system "user". It creates, reads, modifies and deletes files. It can also ask for locks. The client can also perform file striping (i.e., breaking a large file into smaller pieces) and file shredding (i.e., generating ECCs if desired). The client is an unavoidable point of failure for all actions, since it is the initiator, so the system makes it the sole possible point of failure, by requiring it to authenticate the successful completion of every action.

The system maintains metadata associated with every file. The metadata can include standard file system information such as creation time, modification time, and size. The metadata contains additional information related to the distributed nature of the file system, such as, but not limited to, block locations. Block locations are just pointers to storage managers, i.e., entries in the storage manager DHT. File metadata also contains information about the type and degree of redundancy with which the file is stored. For example, if using an error correction code, the metadata includes the number of shreds needed for recovery, as well as the number of shreds that can be lost without losing resiliency. The metadata may also include data about locks.

In a preferred implementation, the metadata for all files managed by file manager node i is kept in a file on node i. This metadata file also contains local connectivity data about the DHT, including the neighbors of node i to distance 2 and the range of values for which i is responsible. This file (say $m_i$) is itself treated as a file in the file system and hence made redundant. This file also contains the values $m_j$ for all j which are neighbors of i. This is important for healing/recovering metadata files.

A preferred embodiment of the present invention uses two types of metadata. The first type, called discovery metadata, is the metadata required to discover a file (that is, to find where the file is stored, for example, in order to read it). Discovery metadata includes file name, block IDs, desired redundancy and error correction scheme, and soft parameters (if any). Discovery metadata changes very infrequently. The second type of metadata is utility metadata. Utility metadata specifies file properties that are useful once the file data is known. Utility metadata can include, but is not limited to, modification time and access time.

The system stores all file metadata at the file manager level, as this makes certain types of queries easy. However, not all of the metadata will be the responsibility of the file manager to backup. Utility metadata can be backed up by the storage manager within (or as part of) the file itself. This is useful, since it prevents recursion when modifying a file, inasmuch as the change of discovery metadata can yield at most one backup of a file manager metadata file, whereas the change of utility metadata requires no backup of a file manager metadata file. This also means that, for most accesses of a file, no change is required at the file manager level. Not all metadata is maintained for all files. For instance, "time accessed" will not be maintained for some file systems according to the invention. This can be a per file decision, although the choice of which metadata to store for a given file is utility metadata. This division of labor slightly complicates the recovery process, as when recovering the metadata for a file manager, which involves both recovering the discovery metadata from the file manager backed-up file as well as polling the storage manager to calculate the latest accurate utility metadata (i.e. that which is held by the latest quorum of storage manager). However, this cost rises infrequently and is not expensive compared to the optimization achieved in average cost complexity. The present invention is the first system in which the metadata of blocks/files is offloaded to the lowest possible location on the hierarchy. In fact, some of the metadata is only backed up at the storage manager level, although it will be maintained in memory of the file manager for faster access.

The ability to lock files is a desirable file system property, but can be difficult to achieve in a distributed file system. As a result, some distributed systems do not enable locking, and some support only read-only files. A preferred embodiment of the present invention implements file locking at the file manager layer. It provides several methods of locking:

Standard locking of an entire file.
Locking of a part of the file, via either the file manager or the storage manager (used for databases, for example).
Update notification: while not a lock in the classic sense, it is rather a request by a client to be informed whenever a file changes. This can be useful when multiple clients modify the same file.

A distributed system with many possible users might require access control, which can be difficult to achieve in a distributed system. The system of the invention leverages the fact that every file has a unique file manager responsible for it to achieve file security. A simple mechanism wherein the client encrypts file data only assures security of data, not of file access. To achieve security of access, a preferred embodiment of the invention uses public-key cryptography between client and file manager when it creates a file. The client uses the public key of the system to communicate with the file manager. The client encrypts and gives the file manager a symmetric key that controls access to the data. The file manager encrypts using symmetric cryptography and sends a different password, pb, for each block to all storage managers that have parts of the data. When accessing data, the client contacts the file manager and requests a block. The file manager then encrypts (pb, t, random) using the symmetric encoding it shares with the storage manager and gives it to the client. The client then uses this as a token to retrieve the data from the storage manager. The embodiment uses this schema for all grants of access (as well as locks) to data from a file. All such access and locks have a time-limited license, in order to prevent a dead client from maintaining a lock. The length of the time grant provided by licenses can be made dependent on the metadata of a file.

Load balancing is the ability to ensure that the amount of work each machine is doing is related to the work that other machines do, such as, for instance, ensuring that the work the machines do is within a constant proportion of each other. When a system is properly load balanced, the maximum amount of work on each machine is decreased, and hence the number of machines and the power requirements of each machine is decreased. This minimizes the cost of the system. As an example using load balancing: Given a file manager, FM_1, with responsibility for a file which resides in storage managers SM_1, . . . , SM_k; if FM_1 feels that it is overloaded, it can create more storage managers (since the load for any storage manager is less than the load for the file manager for the same file). Once the ratio of load on a storage manager to the number of storage managers is high enough, the FM_1 can outsource the provision of storage managers to neighboring file managers, since all queries to FM_1 are routed via a neighbor. Recursively doing this yields load balancing.

A preferred embodiment of the system manages several aspects of load balancing for optimal performance:
1. Load balancing of the DHT key range.
2. Load balancing of the communication load among storage managers.
3. Load balancing of disk usage among the storage managers.
4. Geographic load balancing, which allocates files to storage managers that are closer to where they will be accessed from. This renders access faster if the request comes from the usual area of access.

There are tradeoffs between the different aspects of load balancing. Furthermore, there are tradeoffs between the costs and the benefits of load balancing. There are two classes of load balancing algorithms. In static load balancing, data is not moved after its initial allocation. In dynamic load balancing, data may be moved after creation. The preferred embodiment uses both classes of load balancing. The system performs static load balancing when a file is created or modified, as well as dynamic load balancing based on changing load. It performs dynamic load balancing when static load balancing does not suffice, such as, for example, when large portions of the system crash, based on anticipated need as well as on system resources. For load balancing in the key-space, there is no resource constraint, as the load is minimal, so the system can load balance keys frequently The load balancing mechanism of the underlying DHT performs balancing among DHT keys. This type of load balancing typically balances keys and not key usage, but a key balancing algorithm can easily be modified to a key usage balancing algorithm by weighting keys with their time-weighted average use and normalizing.

A preferred embodiment of the system achieves static load balancing among storage managers on file creation as follows. When creating a file requiring b blocks, the system queries $2b$ storage managers and asks about their load. (Actually, much less than $2b$ is needed, but the analysis is easier for $2b$.) Then the system can choose the b storage managers with the lowest load. When using geographic load balancing, these are the storage managers that return to the client quickest. Similar to the balls in bins protocols of Feige, this will result in logarithmically approximate load balancing. Finally, for the class of dynamic load balancing algorithms, the system can use online algorithms similar to those used for migration of CPU tasks in distributed systems.

One aspect of a preferred embodiment of the system is load balancing via response sampling. When a machine (e.g., a storage manager) is needed, the system will not choose a single storage manager, but rather will query a set of storage managers. The system will then choose the "best" (such as, for example, the fastest, geographically best located, or least loaded) among the respondents and then utilize that machine There are several protocols used by preferred embodiments of the system. A file storage system can benefit greatly from global knowledge about the system. For example, load balancing can benefit from knowing the load on all nodes, partition detection can benefit from knowing the number of nodes in the system, and so on. In a distributed system, it may be difficult or impossible to obtain such knowledge accurately: each node has local state knowledge, but a node cannot know the precise state of other nodes. Fortunately, it is sufficient to know global values approximately.

One preferred embodiment uses a gossip protocol to approximate these values. It assumes that every node (file manager or storage manager) participating in the gossip protocol has a local clock. Denote by $t_i^0$ the internal clock time when node i joined the system. At time $t_i^0+j$ for all integer j, node i does as follows:
1. Merge all data received from all of its neighbors prior to the current time.
2. Discard all outdated data (when i has received more recent data from the relevant node).
3. Add its own data, along with its current time stamp, to the list.
4. Send all of the current data (i.e., there is no data which has a larger time stamp) to all of its neighbors.

Due to the logarithmic length of all-pairs shortest paths in the DHT, this protocol is guaranteed to be accurate up to a logarithmic time difference in the data conveyed. Assuming that the clock's accuracy is bounded, this gossip protocol gives an approximation for the accuracy of the required information.

Distributed file systems, or, more generally, file systems with the ability to recover corrupted or missing data, can recover or heal from failures. But as disk sizes increase, the time required to recover from failure increases linearly. In fact, conventional systems are likely to reach a point where data is corrupted faster than it can be recovered. Conventional hardware optimizations can be useful, but they are expensive, and historically they have not scaled as quickly as disk sizes. This gap between disk size increases and communication and bus speed increases implies that the problem of recovery in conventional systems is likely to get worse. The present invention can recover lost data very quickly. This is due to its use of DHTs to separate how a file is found from where it is stored. The system separates reconstruction of metadata, which can be performed quickly due to the small size of the metadata, from the recovery of the data itself, which can be performed in a distributed manner and hence quickly.

At a high level, the protocol for healing the system after failure is as follows:
1. Detect a failure.
2. Reconstruct the metadata. Fix the DHT and reallocate responsibility for the DHT. Distribute responsibility for data reconstruction.
3. Reconstruct data.
4. Rebalance the system (including small files).

It will be clear to one of skill in the art of the invention that there are many ways of implementing this protocol, in addition to the implementations described herein.

A simple way to detect node failures is through the built-in functionality of the DHT. One of the keys in DHT design is a low out-degree from any node. As mentioned above, the DHT generally maintains links between nodes as open connections. This means that the failure of a single node can be detected by its neighboring nodes in the graph-based DHT representation. If node i suspects a failure of one of its neighbors j, it consults with all of the other neighbors of j. They reach a Byzantine agreement as to the status of j. If they agree that j has indeed failed, than j is declared failed. If j eventually recovers, it will consult its neighbors as to its status.

A system according to the invention can recover from more than a single failure. In fact, the system can recover from K concurrent failures for any given K. If K is smaller than the outdegree of the DHT, then the system can simply treat each failure separately. More generally, if each failed node has a connected node that has not failed, the system can solve the problem. However, in general this is not the case. For the general case, the set of failures represents a subgraph of the graph representation of the DHT. As such, consider the connected component of failures. Since K<<N, the edges of the connected component have neighbor nodes which have not failed. Thus, the edge nodes of the connected component of failures will be detected and such failures will be broadcast. If there is a node which has not notified the network of failures and whose neighbors have failed, the node itself must have failed. Alternatively, a recursive procedure can be used to recursively find and correct failures. Once failure has been detected, the entire graph may be notified. This is done by the detecting node, utilizing the underlying gossip layer to notify the graph of failures. In addition, to circumvent possible disconnections in the graph, the detecting node will choose some random nodes (via the DHT) to also notify the graph. If multiple gossip protocols attempt to give out the same information, this will not result in any overhead.

The system keeps discovery metadata in a file replicated within the system. This means that it can recover the metadata by using the underlying failure recovery mechanism (that is, copying the data or reconstructing using an ECC). While the recovery process is relatively simple, this process is crucial, as the system must know what data to reconstruct before it can reconstruct it. Thus, metadata recovery allows the system to allocate responsibility for recovering the data. Once the metadata has been recovered, the system can use the underlying processes of the DHT to allocate responsibility for the missing part of the DHT. Such processes typically include load balancing of the key space. When the system finishes reconstructing the discovery metadata and does DHT load balancing, it is possible that the range of values maintained by the crashed file manager will be maintained by multiple new file managers (generally at most two, unless massive failure was involved). Any file manager that finds itself the maintainer of a new range of values as a result of a crash will query all storage managers involved in storing the data to check for integrity. This can (optionally) include checking the consistency of recently modified files, although this is not necessary, since the client is responsible for this and if the client crashes, the system does not need to provide any guarantees. During such queries, the system also reconstructs the utility metadata from the relevant storage managers. Alternatively, storage managers can take responsibility for the reconstruction.

A key reason why reconstruction in general is so time consuming is the communication bottleneck due to the attempt to move all of the corrupted/lost data in a machine to a replacement machine. While this is costly during the recovery process in classical architectures, it is worthwhile inasmuch as it results in faster lookup time when there is no failure. Since failures are assumed to be rare, this tradeoff between the cost of repairing failures and the cost of running without failures is a valid one. The system architecture of the present invention avoids this bottleneck by disassociating where a file is stored from how it is accessed. Data reconstruction, and subsequent reallocation of the DHT, results in a single file manager that is responsible for any given file.

An innovation for reconstruction of the lost data is that the bandwidth for any individual node is dwarfed by the total system bandwidth. This means that if the system can distribute the recovery across the system, it can achieve rapid recovery. There are many ways in which the system can use the separation between how and where data is stored. One particular example uses the background layer to notify about failure and allocate responsibility. In this example, assume that a given file manager is trying to recover a disk of size s. The system can then distribute the metadata. The file manager then chooses a random number 0<r<1. For block i on the disk, assuming that the block is indeed used, the DHT node responsible for the value (i/s+r)mod1 will endeavor to reconstruct the block i. This means that the load balancing of reconstruction is at worst a factor 2 from optimal. If a node is responsible for reconstructing the block I, it will poll the nodes containing the data needed to reconstruct the data assuming the underlying reconstruction mechanism. When it has completed reconstruction, it will notify the file manager responsible for that node. If it cannot reconstruct the data for any reason (such as, for example, lack of disk space), it will likewise notify the file manager. If the file manager does not receive such a notification for any given block, it will simply choose a new random number and attempt a new reconstruction for the missing blocks, unless there is a small number of such blocks, in such a case it will reconstruct them by itself. Any storage manager that wishes to reconstruct a given block can do so easily by requesting the data needed for doing so and utilizing the underlying protocol. When the data is finally reconstructed, every file manager needs to receive the address of the new data stored. If the data is invalid (due possibly to modifications), the file manager will discard the data at the earliest possible stage.

While this approach yields extremely fast reconstruction, it suffers from several drawbacks. The first is that reconstruction requires some free space on all storage managers. Such free space is reduced by reconstruction and this might result in lack of space. The second problem is that the reconstruction might result in a skewed load balance across the system. Finally, reconstruction might mean that small files are not located in the file manager, which might result in slower access times. All of these problems can gradually be reduced by moving files across the system. Since the system is at the required redundancy, these corrections can take a longer time frame than that required for healing without impairing system guarantees.

In conventional file systems, when a disk crashes it is necessary to replace the disk. This is because the ability to find a file is linked to the location of the file. For example, in RAID systems there is a correlation between data stored on various disks and cylinders. In iBrix®, the file ID essentially includes an address of the disk on which the file is stored. Thus, recovery must reconstruct the failed disk. Obviously, this introduces a bottleneck in recovering from failure, since the communication time to the disk (as well as disk i/o) throttles the recovery time. Attempts to bypass this bottleneck generally rely on increasing disk and communication speed with specialized hardware and algorithms. By disassociating the responsibility for the file (and metadata) that lies with the file manager from the responsibility for the actual storage of the file, which remains with a large number of storage managers, the present invention removes this bottleneck.

The system of the invention reconstructs the failed disk in a completely distributed fashion across the entire distributed file system. If a disk is of size size with a throughput of throughput, typical file system recovery would require size/throughput time. By distributing the system over N disks, the system requires min {log N, log size}+2*size/N*throughput The factor 2 is assuming the hard case in which upload throughput detracts from download throughput. The first factor is the time required to distribute responsibility or for all responsible nodes to become aware of a failure, and the second time is the time required for a given node to reconstruct the part of the data for which it is responsible. In most cases these two factors will run in parallel, but even this worse case analysis is much faster than conventional implementations.

Table 1 presents a summary of actions that may be taken.

TABLE 1

| Action | Initiated by | Involved | Responsibility | Comments |
|---|---|---|---|---|
| Create file | Clients | FM, SM | Client | FM can act as clients for system files |
| Read file | Client | FM, SM | Client | FM can act as clients for system files |
| Delete file | Client | FM, SM | Client | If client crash during action FM will complete |
| Modify file | Client or FM | FM and/or SM | Initiator | Can modify data and/or metadata |
| Detect failure | Adjacent FM | All Adjacent FM | Initiator | Can be done recursively |
| Recover FM | Upon failure detection | Backups of FM file | FM neighbors | Not distributed |
| Recover SM | Upon failure detection | Entire system | FM(s) | Is completely distributed |
| Gossip updates | Entire system | Entire system | Entire system | Not centralized |
| Locking | Client | FM or SM | Client or timeout | Different types of locks |
| Rebalancing FM | FM(s) | Adjacent FM on the [1, 0) ring | FM | Based on DHT protocols |

One problem peculiar to distributed systems is the case of a partition in a network. While the system can deal with isolated failures, it also needs to deal with the case when, due to communication or other problems, the network itself is split into two. Partitions pose peculiar problems, due to both the magnitude of the errors as well as the temporary extent of them. A partition event refers to a total lack of communication. Slow communication can be dealt with much more effectively by utilizing load balancing protocols. There are three major issues having to do with partitions:

1. The detection of a partition event.
2. File access, modification, etc. while in a partitioned state.
3. Recovery from a partition event and a merging of the system.

In general, a partition into multiple parts can be thought of as an initial partition into two parts and then subdividing one or more of the parts into subsequently smaller parts. Each division can then be treated independently. For simplicity, the following discussion assumes that any partition event divides the system into two parts, but it will be clear to one of skill in the art of the invention that the general case can be solved recursively.

Detecting a partition. The system uses the gossip protocol in the background layer to estimate the number of nodes in the system at any given time. This estimate will differ among different nodes in the system. Any node that has a sharp (relative to normal usage) dropoff in system size will detect a partition event. The end of a partition event is detected similarly.

Operation during partition. There are several possibilities for operation during a partition event. In increasing complexity of recovery, these are:

1. Only allow changing of files for which the relevant file manager and block managers can be accessed. This allows unrestricted creation of files.
2. Allow changing of files for which the file manager is accessible, but at a reduced resiliency. A sub-possibility is to reconstruct only files that are modified on the partition with the relevant file system.
3. Recover and redistribute file managers when possible and allow file changes as above.

Since different nodes might have different views of the existence of a partition event, this will be determined by the view of the relevant file manager or, in the third case, by the neighbors who decide to recover the file manager.

Operation after partition. At the termination of a file manager, the system must merge possibly divergent data. For the partition events above above, a preferred embodiment does as follows:

1. In this case, connecting the partitions is simple, due to the uniqueness of the file manager.
2. In this case, the system must merely repair the system to its required resiliency at the end of the partition event. If resiliency was increased during partition, redundant blocks are erased and the load balancing algorithms are invoked.
3. In this case, the system may result to some journaling or file specific algorithms, since the appropriate manner of dealing with multiple files with different changes is data-dependant.

Figure 4:
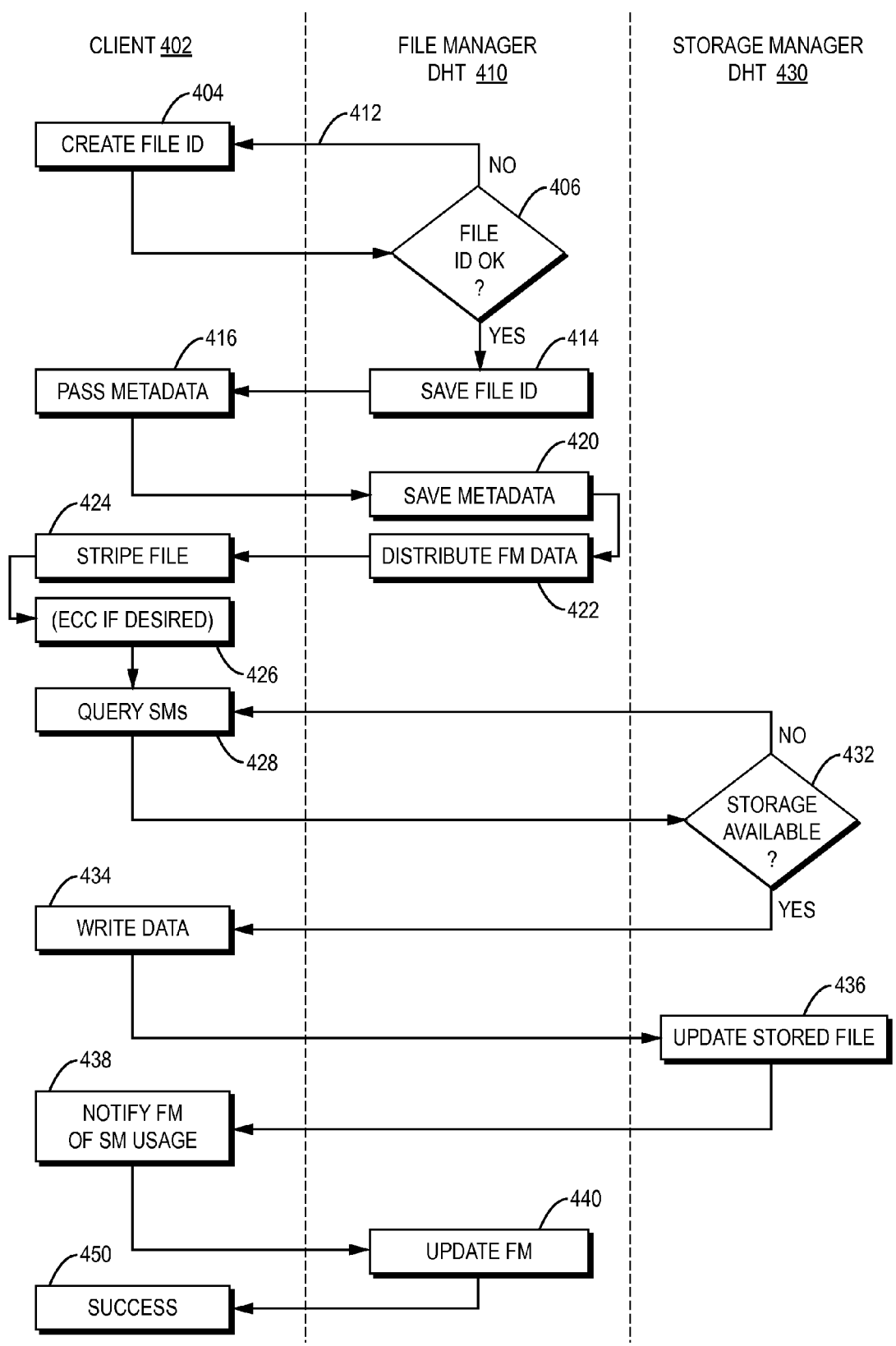
FIG. 4 is a high-level flow chart that depicts the steps involved in creation of a file, according to an exemplary embodiment of one aspect of the present invention.

File creation is normally initiated by a client, but may also be initiated by the system when adding a new node. FIG. 4 is a simplified high-level flow chart that illustrates the main steps in the process of creating a file in an illustrative implementation of this invention. For the exemplary embodiment of FIG. 4, the steps and actors are:

1. Client 402: Choose 404 random file ID for File manager DHT key. In some applications the ID can be deterministically decided.
2. Client 402: Query 406 File manager DHT, accessed via a previously used DHT node, preferably one that client 402 thinks has responsibility for the file ID, to find File manager 410 responsible for file ID.
3. File manager 410, Client 402: If number is not unique 412 (e.g., file ID already exists), return to step (1).
4. File manager 410: Save 414 file ID and reserve it. If consistency is desired, then apply locks.
5. If maintaining a CAN (content addressable network), then return to step (1) with the content hash, except that step (3) is replaced by simply maintaining a new pointer and finishing.
6. Client 402: Give 416 File manager 410 metadata about the file. This can include, but is not limited to, size, dates, permissions, number of n and k, and usage patterns (if known).

7. File manager 410: If permissions exist, then provide Client 402 with a number of potential storage managers to store file, such that the number of potential storage managers is larger than what is actually needed.
8. File manager 410: Save 420 metadata in File manager record (no need to backup at this stage).
9. File manager 410: Distribute 422 file comprising File manager data as a client.
10. Client 402: Stripe 424 file.
11. Client 402: Error encode 426 stripes.
12. Client 402: Contact 426 Storage manager 430 with query 432 on potential space.
13. Client 402: Write 434 data on storage managers that fit load balancing criteria (for example, but not limited to, first to answer).
14. Storage manager 430: Update 436 file with information stored on current disk. Update is done via process for modifying files (see below). Notify Client 402 when finished.
15. Client 402: Notify 438 File manager 410 of which storage manager used. File manager 410 does not need to know where Storage manager 430 saved the data. If File manager 410 crashes and this data is missing, then the system will revert.
16. Client 402: When complete, notify 440 file managers and File manager 410.
17. Storage manager 430: If timeout occurs and notification of completion has not been received, then contact File manager 410 to receive status. Revert based on consensus of Storage manager 430. Always revert if File manager 410 did not receive the list of storage managers. Wait for ack from File manager 410 that all storage managers are updated.
18. Storage manager 430: Use background channel to notify file manager servers of new space available.
19. File manager 410: Act as client and distribute the file modified in the previous step.
20. Client 402: Receive ack from File manager 410 before exiting 450. If problems, return to step (1). File manager 410 receives acks from the storage managers (although these acks can be done via the client) before acking to Client 402.

Figure 5:
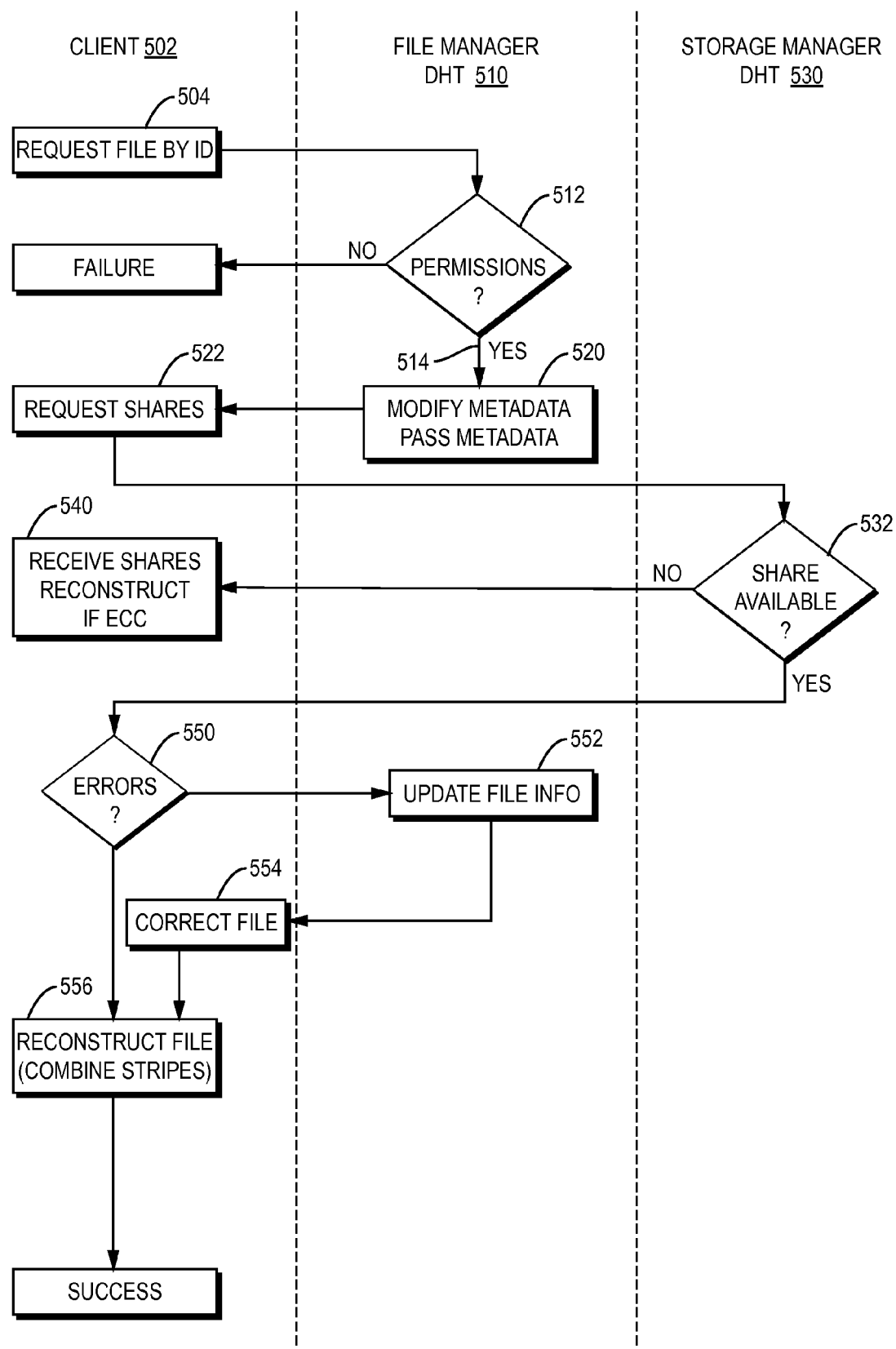
FIG. 5 is a high-level flow chart that depicts the steps involved in reading a file, according to an exemplary embodiment of one aspect of the invention.

Reading a file can be initiated by multiple actors in the system. FIG. 5 is a simplified high-level flow chart that illustrates the main steps in the process of reading a file, in an illustrative implementation of this invention. In the example shown in FIG. 5, the file read is initiated by Client 502. For the exemplary embodiment of FIG. 5, the steps and actors are:

1. Client 502: Access File manager DHT via previously used node and ask 504 for file based on ID (this can be either a random number-created or a content-based number).
2. File manager 510: If permissions 512 exist 514, then notify Client 502 of which storage managers have the file, as well as which shred each file manager has. Give client metadata such as n, k.
3. File manager 510: Modify 520 and backup metadata (such as, but not limited to, time last accessed).
5. Client 502: Contact 522 storage managers that hold file, such as Storage Manager 530, to see if shares are available 532.
6. Client 502: If there is a conflict between File manager 510 and the storage managers about the existence of a file, notify both and they will read (and correct) the backup copies of their files.
7. Client 502: Receive 540 shares and (possibly) reconstruct the stripes.
8. Client 502: (optional) Use redundant share to test file integrity.
9. Client 502: If the file has errors 550, notify File manager 510. Else skip to final step.
10. File manager 510: Change file information 552 and tell Client 502 to collect, correct, and restore file.
11. Client 502: Correct file 554 via error correction (perhaps on a server). Update File manager 510.
12. File manager 510: (optional—since this will be done periodically) If timeout occurs, then correct file.
13. Client 502: Combine stripes to reconstruct file 556.

Figure 6:
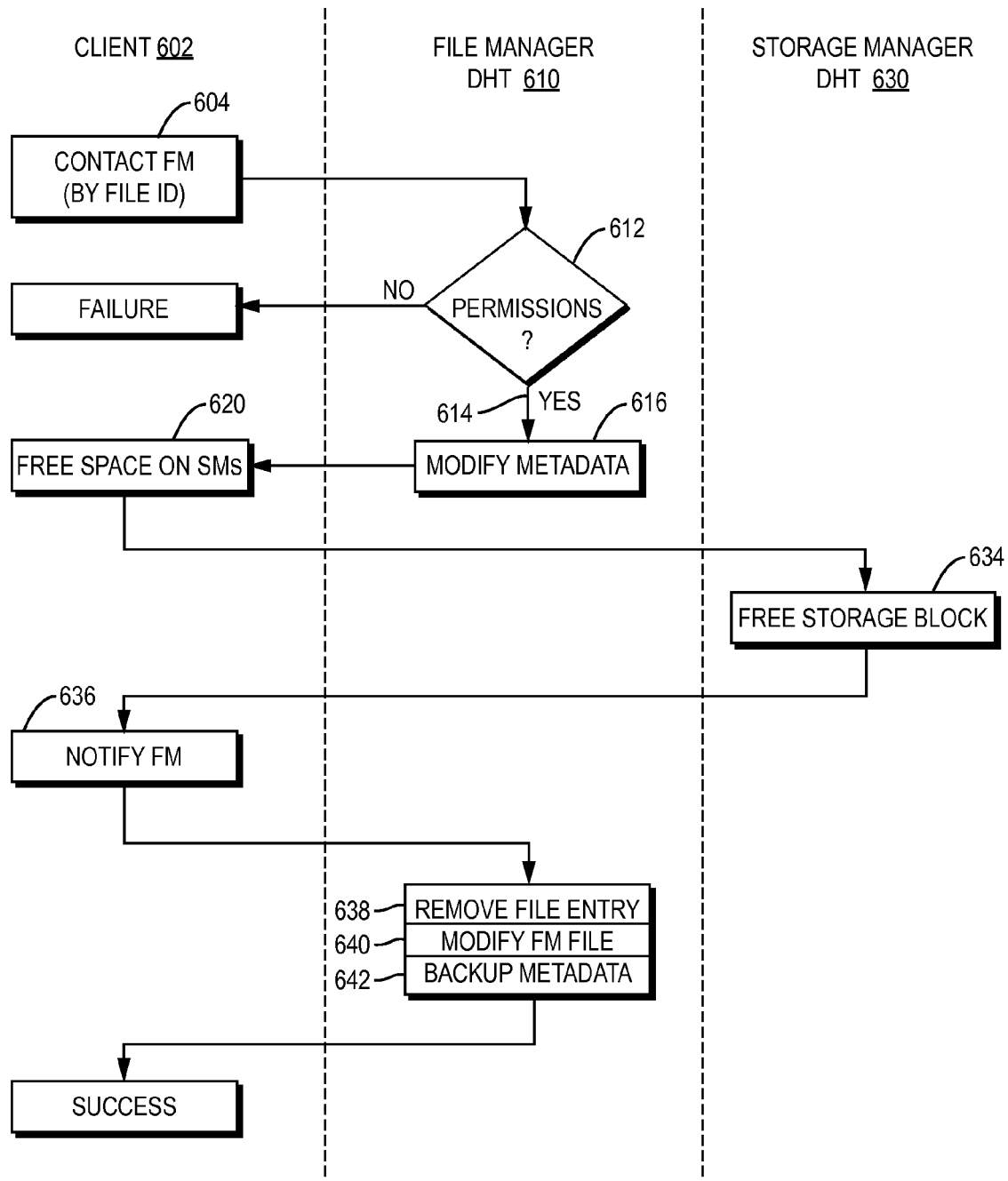
FIG. 6 is a high-level flow chart that depicts the steps involved in deleting a file, according to an exemplary embodiment of one aspect of the invention.

File deletion is generally used only by clients. FIG. 6 is a simplified high-level flow chart that illustrates the main steps in the process of deleting a file, in an illustrative implementation of this invention. For the exemplary embodiment of FIG. 6, the steps and actors are:

1. Client 602: Contact 604 File manager DHT and ask for information.
2. File manager 610: If permissions 612 exist 614, then give information. If there is consistency, then lock the file. If consistency and already granted permission, then wait till permission ends.
3. File manager 610: Modify 616 metadata.
4. Client 602: Contact 620 storage managers, including Storage manager 630, which free 634 space.
5. Client 602: Contact File manager 610 and notify 636 that space freed.
6. File manager 610: If completion and no open entries using file, then erase file.
7. File manager 610: Remove 638 file entry and modify 640 the File manager 610 file for the node. Backup 642 metadata. ack to Client 602.
8. Storage manager 630: If timeout occurs, notify File manager 610 of timeout and wait for ack from File manager 610.
10. File manager 610: If timeout occurs, then notify storage managers that space freed. When ack received from all storage managers, then ack to the notifier (if one exists). Storage managers of servers on which shares were removed use background channel to notify all file manager servers of new space available.
11. Client 602: Receive ack from File manager 610 and file managers before exiting. If no ack is received and timeout occurs, then return to step (1). The final ack is from File manager 610 that has received acks from all storage managers.

Steps for changing metadata:

1. Client: Contact the File manager and notify it of change in metadata.
2. File manager: If permissions, then change metadata.
3. File manager: Update File manager file via regular backup process.
4. Client: Receive ack from File manager and Storage manager before exiting. If no ack is received and timeout occurs, then return to step (1).

In some types of files, there will be large modifications. When doing such modifications, the system does not have to reuse the same storage manager. Since the main cost is the communications, the system can simply use a new storage manager for the data. This is useful if the old storage manager has become overused or is temporarily unavailable, and it is especially useful if a storage manager has failed. The race condition between reconstruction of the old (unmodified) data and the new data can be settled with every interaction with the file manager (which does not change), so that if old data is later reconstructed it will be discarded, at the latest, at the final update of the file manager as to where reconstructed data is located.

Figure 7:
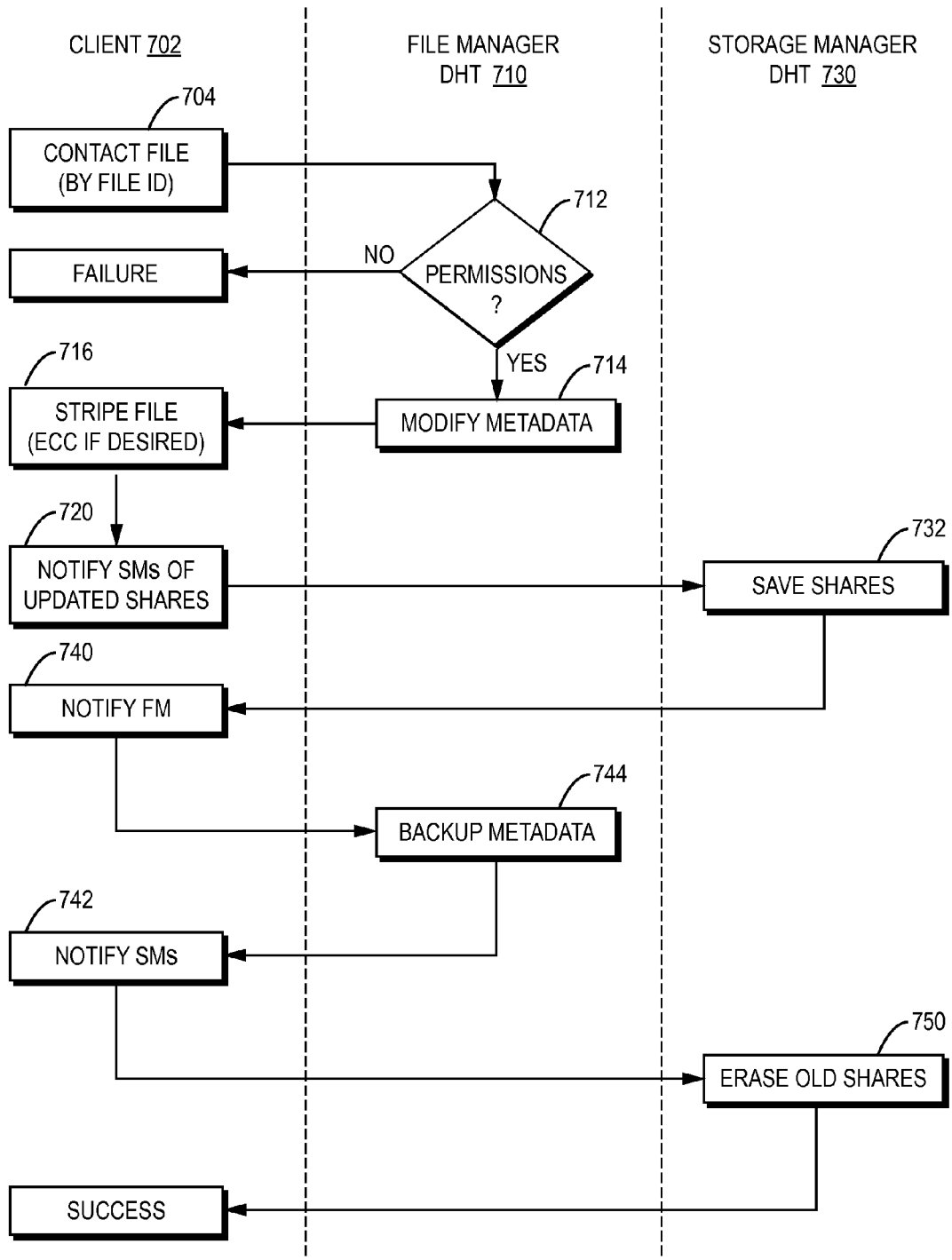
FIG. 7 is a high-level flow chart that depicts the steps involved in modifying a file, according to an exemplary embodiment of one aspect of the invention.

File modification can be initiated by any actor in the system. The differences in implementation is solely in how things are cached. FIG. 7 is a simplified high-level flow chart that illustrates the main steps in the process of modifying a file, in an illustrative implementation of this invention. In the example shown in FIG. 7, file modification is initiated by Client 702. For the exemplary embodiment of FIG. 7, the steps and actors are:

1. Client 702: Contact 704 File Manager DHT and get file information.
2. File Manager 710: If permissions 712, give information.
3. File Manager 710: If consistency, then apply locks/notification mechanism.
4. File Manager 710: Modify 714 metadata.
5. Client 702: Stripe 716 file and encode it. This should be done first when possible.
6. Client 702: Contact 720 Storage manager 730 with replaced shares. If Storage manager 730 crashes, allocate a new storage manager. This is done upon any contact with File Manager 710, but most certainly at the final stage of reconstructing the old storage manager, which updates File Manager 710. If the reconstructed data is invalid, File Manager 710 will discard it.
7. Storage manager 730: Save 732 new shares (but maintain old ones also). A preferred embodiment of the system maintains two sets of shares in case the client crashes during the operation, so that the system can revert to a consistent state. (This case is not strictly within the system guarantees, since it is a client fault).
8. Client 702: Finish updating shares and notify 740 File Manager 710, and then notify 742 storage managers of completion when ack is received from File Manager 710.
9. File Manager 710: Backup 744 metadata and send ack to client.
10. Storage manager 730: If notified of completion, then erase 750 old share.
11. Storage manager 730: If timeout occurs and no notification has been received, then query File Manager 710. Revert based on the latest version for which the system has enough shares. Query until ack received from File Manager 710 on correct reversion. The system will have enough shares to reconstruct at least one version, since if a storage manager deletes an old share, it must follow that all of the storage managers have new shares.
12. Client 702: Receive ack from File Manager 710 and the other file managers before exiting. If no ack received and timeout occurs, then return to step (1). Last ack is from File Manager 710 (which received the final ack from all storage managers).

In some cases it makes sense to get a lock for a file, read the file and then modify it. This can be done by a simple concatenation of existing operations. The system allows a modify command to change existing blocks/files. However, it is not required to modify the entire block, just the relevant parts that have changed. For replications, this is quite easy, whereas for an ECC (e.g. Reed Solomon), the bits that have changed in the code are fixed. The number of bits is generally bounded by the amount of change.

In the preferred embodiment, the system performs all file access through the responsible file manager, which maintains a list of authorized users. If desired, a client can also encrypt file data on the client side, so that the data actually stored by the system is meaningless without decryption. The system grants file operation permissions on a time lease basis with the possibility for renewal. This enables migration, and also has advantages from a security perspective.

The preferred embodiment uses the current time for timeouts and for leases. It is not possible to achieve a shared network clock in a distributed system. For timeouts, every component can simply use its own clock. For leases, the system has the receiver (generally, but not limited to, a storage manager) terminate a lease earlier than the grantor (generally, but not limited to, a file manager). The early termination is a measure of network speed (e.g., twice the average roundtrip delay).

Network failures and soft thresholds. In some applications, the system may experience intermittent node failures (such as due to transient network failures, for example). This can cause recurring reconstructions, possibly at considerable cost. Some embodiments of the system can deal with this by using soft reconstruction thresholds. For example, if a client requires 8 copies of a given file, the system can keep 10 copies instead, and perform reconstruction only when the number of available copies falls below 8.

In general cases of redundancy, the required threshold is fixed and each file has a desired level of redundancy which it aspires to and which the system maintains. However, there are cases, such as intermittent networking errors, when this is undesirable. In this case, two levels of redundancy are retained-a maximum and a minimum level. The system only repairs itself when reaching (or passing) the minimum level. However, when the system decides to create redundancy, it will do so to the maximum level, which the system will then maintain. Obviously, repeating this under random partitions will yield a system that is robust to random partitions. In fact, there is no hard limit on the level of redundancy and the desired level or redundancy can vary among files. One advantage of differing levels of redundancy on a per file basis is that it enables higher levels of redundancy for files that are under demand. This can then be used for load balancing purposes, such that files which are more frequently requested will have higher level of redundancy. In addition, geographical demands can be taken into account, such that, in a geographically spread out system, the redundancy will be in the local area of demand.

In some embodiments, the system can support advanced file system properties. Several extensions to the basic architecture of the present invention may be advantageous, including virtualization, lean (thin) provisioning (charging only for actual storage use), journaling (adding file version numbers), security (adding secure system access by controlling the file manager and storage manager security levels) and deduplication (eliminating the storage of duplicate blocks or files). The system can also work with any type of erasure coding (ECC) for the blocks. For virtualization, the distributed nature of the system allows a process running on one machine to be moved easily to a different machine. For a file manager, the only overhead is some possible modification at very low cost. The system design is also suitable for lean provisioning, since it does not allocate space that is not used. The system can collect usage data and control total usage via its gossip protocols. The system may additionally act as a journaling system—since a single file manager is responsible for maintaining any given file, the responsible file manager can maintain a journaling system, possibly saved on different storage managers than the current version of the file. This journaling system can maintain either the entire file or file differences (deltas).

In many storage applications, it is valuable to identify and eliminate multiple files with the same data ("deduplication", in order to eliminate duplicate copies of file data). This is especially difficult in a distributed system, where there is no centralized ability to compare files, as files are not stored on the same computer. The simplest form of deduplication identifies identical files. The system may identify identical files by using a hash of the file data as the file identifier. This requires a file to move to a different file manager whenever it is modified, but changing the file manager is simple and incurs very little overhead. This is due to the separation of the file manager and storage manager levels.

A file storage system can achieve greater storage efficiency if it recognizes files that are similar but not quite identical, for example by storing a master file plus a list of differences for each similar file. The method described above works well for identical files, but it poses problems when files are merely similar. The system, in some embodiments, can use signatures to detect similar files. A file signature is a set of values from random (but fixed) locations in the file. If the FFT from two files has a high value, then the files are similar, and the location of the file difference can be detected by binary search. The system can use a fingerprint hash to maximize the probability that two similar files will map to the same file manager. This can be further augmented by using the gossip protocol or other methods to transfer signatures, or hashes of signatures, between file managers.

The system supports several methods of data encryption. The most straightforward method is for the client to encrypt/decrypt all data before providing it to the system. This has great security advantages, as it removes all possible chance of data being compromised. However, deduplication does become impossible with this method, since the user chooses the encryption key and duplicate files encrypt to nonduplicate files. Another encryption method uses secure connections (e.g., SSL) between the client and the file manager or storage manager. Then the file manager can choose the encryption keys used by the file manager/storage manager. It will be clear to one of the skill in the art that many of the other possible encryption schemes in the literature are suitable for use with the present invention. A particular design decision for any particular implementation is whether the system uses independent encryption for each share or uses a homomorphic scheme. For files stored using an ECC, the system can choose encryption keys to guarantee that no share is in plaintext.

The expanding importance of cloud computing and the rapidly growing storage requirements of even small to medium sized enterprises creates an increasing demand for robust large-scale expandable storage. The present invention may be used to advantage to satisfy this need. Currently, systems that include a failed machine will discard all data on that machine. The present invention allows a failed machine that has been rebooted/repaired to be utilized, with all data.

Section headings or titles used herein are for convenience only, do not limit the scope of this invention in any way, and are not intended to affect or limit the description of this invention. The term "herein" refers to this entire patent or patent application, and not merely to the section in which such term appears. While preferred embodiments are disclosed herein, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention, which is not to be limited except by the claims that follow.

What is claimed is:

1. A dynamically scalable redundant distributed storage system, the storage system having a plurality of components, the components comprising:
   a plurality of file managers, each file manager having responsibility for providing access to a group of stored files or data blocks;
   a file manager control component adapted for allocating individual responsibilities among each of the plurality of file managers and for detecting component failures and allocating the responsibility for reconstruction when failures occur;
   a plurality of storage managers, each storage manager having responsibility for managing the storage of files and data blocks on one or more data storage devices; and
   at least one client adapted to provide user access to the storage system, the client being configured to initiate actions within the storage system;
   wherein the distributed storage system has no single point of failure, replication of files is implemented consistently; and
   wherein the distributed storage system has no need for exact global knowledge of the state of the system and approximate knowledge is sufficient for recovery and healing of corrupted and missing data.

2. The distributed storage system of claim 1, wherein there is no exact time synchronization of components in the system.

3. The distributed storage system of claim 1, wherein each file manager is configured to store metadata associated with each of the files and data blocks for which it is responsible, the metadata including discovery metadata, utility metadata, and a unique file identifier for each file or data block, the metadata for all files managed by a file manager is kept in a file on the file manager.

4. The distributed storage system of claim 1, wherein the file manager control component is configured to assign file management responsibilities for individual files and data blocks to individual file managers, and to maintain a record of which files and data blocks are assigned to each file manager.

5. The distributed storage system of claim 1, wherein the file manager control component is implemented using a distributed hash table.

6. The distributed storage system of claim 1, wherein each of the plurality of storage managers is configured to maintain a record of a location of each stored file and data block on the data storage devices.

7. The distributed storage system of claim 1, further comprising a storage manager control component adapted for allocating individual responsibilities among each of the plurality of storage managers, the storage manager control component being configured to assign file storage responsibilities for individual files among individual storage managers and to maintain a record of which files and data storage devices are assigned to each storage manager.

8. The distributed storage system of claim 1, wherein the client initiates actions within the storage system by means of the file manager control component and a storage manager control component, the client further comprising a processor configured to implement a redundant data recovery and reconstruction scheme.

9. The distributed storage system of claim 1, wherein the recovery and healing of corrupted and missing data consists of a method comprising the steps of:
   a. detecting a failure;
   b. utilizing a gossip protocol to notify the system of failures;
   c. reconstructing metadata;
   d. fixing the file manager control component and a storage manager control component;
   e. reallocating responsibility for the file manager control component and the storage manager control component;
   f. distributing responsibility for data reconstruction;
   g. reconstructing data;
   h. rebalancing the system.

10. A dynamically scalable redundant distributed storage system, the storage system having a plurality of components, the components comprising:
   a plurality of file managers, each file manager having responsibility for providing access to a group of stored files or data blocks;
   a file manager control component adapted for allocating individual responsibilities among each of the plurality of file managers and for detecting component failures and allocating the responsibility for reconstruction when failures occur;
   a plurality of storage managers, each storage manager having responsibility for managing the storage of files and data blocks on one or more data storage devices; and
   at least one client adapted to provide user access to the storage system, the client being configured to initiate actions within the storage system;
   wherein the distributed storage system has no need for exact global knowledge of the state of the system and approximate knowledge is sufficient for recovery and healing of corrupted and missing data; and
   wherein replication of files is implemented consistently.

11. The distributed storage system of claim 10, wherein the distributed storage system has no single point of failure.

12. The distributed storage system of claim 10, wherein there is no exact time synchronization of components in the system.

13. The distributed storage system of claim 10, wherein each file manager is configured to store metadata associated with each of the files and data blocks for which it is responsible, the metadata including discovery metadata, utility metadata, and a unique file identifier for each file or data block, the metadata for all files managed by a file manager is kept in a file on the file manager.

14. The distributed storage system of claim 10, wherein the file manager control component is configured to assign file management responsibilities for individual files and data blocks to individual file managers, and to maintain a record of which files and data blocks are assigned to each file manager.

15. The distributed storage system of claim 10, wherein the file manager control component is implemented using a distributed hash table.

16. The distributed storage system of claim 10, wherein each of the plurality of storage managers is configured to maintain a record of a location of each stored file and data block on the data storage devices.

17. The distributed storage system of claim 10, further comprising a storage manager control component adapted for allocating individual responsibilities among each of the plurality of storage managers, the storage manager control component being configured to assign file storage responsibilities for individual files among individual storage managers and to maintain a record of which files and data storage devices are assigned to each storage manager.

18. The distributed storage system of claim 10, wherein the client initiates actions within the storage system by means of the file manager control component and a storage manager control component, the client further comprising a processor configured to implement a redundant data recovery and reconstruction scheme.

19. The distributed storage system of claim 10, wherein the recovery and healing of corrupted and missing data consists of a method comprising the steps of:
   a. detecting a failure;
   b. utilizing a gossip protocol to notify the system of failures;
   c. reconstructing metadata;
   d. fixing the file manager control component and a storage manager control component;
   e. reallocating responsibility for the file manager control component and the storage manager control component;
   f. distributing responsibility for data reconstruction;
   g. reconstructing data;
   h. rebalancing the system.

20. A distributed storage system, comprising a storage system configured to rapidly reconstruct a failed storage element by distributing data storage across a number of storage elements and reconstructing data stored on the failed storage element by breaking each data file into shreds, distributing the shreds across multiple storage elements, using redundancy or duplication to recover the data from errors, and distributing the recovered data onto free space on remaining system storage elements, wherein the distributed storage system has no single point of failure, replication of files is implemented consistently; and wherein the distributed storage system has no need for exact global knowledge of the state of the system and approximate knowledge is sufficient for recovery and healing of corrupted and missing data.

21. The distributed storage system of claim 20, wherein the recovery and healing of corrupted and missing data consists of a method comprising the steps of:
   a. detecting a failure;
   b. utilizing a gossip protocol to notify the system of failures;
   c. reconstructing metadata;
   d. fixing a file manager control component and a storage manager control component;
   e. reallocating responsibility for the file manager control component and the storage manager control component;
   f. distributing responsibility for data reconstruction;
   g. reconstructing data;
   h. rebalancing the system.

22. A method for recovering and healing corrupted and missing data in a distributed storage system, comprising the steps of:
   a. detecting a failure;
   b. utilizing a gossip protocol to notify the system of failures;
   c. reconstructing metadata;

d. fixing a file manager control component and a storage manager control component;
e. reallocating responsibility for the file manager control component and the storage manager control component;
f. distributing responsibility for data reconstruction;
g. reconstructing data;
h. rebalancing the system;
wherein the distributed storage system has no need for exact global knowledge of the state of the system and approximate knowledge is sufficient.

* * * * *